US008116165B2

(12) United States Patent
Chandra et al.

(10) Patent No.: US 8,116,165 B2
(45) Date of Patent: Feb. 14, 2012

(54) MEMORY WITH IMPROVED DATA RELIABILITY

(75) Inventors: Vikas Chandra, Fremont, CA (US); Cezary Pietrzyk, Los Gatos, CA (US); Robert Campbell Aitken, San Jose, CA (US)

(73) Assignee: ARM Limited, Cambridge (GB)

( * ) Notice: Subject to any disclaimer, the term of this patent is extended or adjusted under 35 U.S.C. 154(b) by 115 days.

(21) Appl. No.: 12/662,533

(22) Filed: Apr. 21, 2010

(65) Prior Publication Data
US 2011/0261633 A1 Oct. 27, 2011

(51) Int. Cl.
*G11C 8/00* (2006.01)
(52) U.S. Cl. .......... 365/230.06; 365/189.15; 365/189.16
(58) Field of Classification Search ............ 365/230.06, 365/189.15, 189.16
See application file for complete search history.

(56) References Cited

U.S. PATENT DOCUMENTS 5,963,489 A * 10/1999 Kirihata et al. ............... 365/200
6,181,596 B1 * 1/2001 Horne et al. .................. 365/168
7,269,091 B2 * 9/2007 Ueda .......................... 365/230.06

OTHER PUBLICATIONS

Fujiwara et al., Quality of a Big (QoB): A New Concept in Dependable SRAM, *IEEE Computer Society*, Feb. 2008, pp. 98-102.
Pilo et al., "An SRAM Design in 65-nm Technology Node Featuring Read and Write-Assist Circuits to Expand Operating Voltage", *IEEE Journal of Solid-State Circuits*, vol. 421 No. 4, Apr. 2007, pp. 813-819.
Lee et al., "SRAM Word-oriented Redundancy Methodology Using Built in Self-Repair", *Dept. of Electrical and Computer Engineering*, (No Date), 4 pages.
Kastensmidt et al., "On the Optimal Design of Triple Modular Redundancy Logic for SRAM-based FPGAs", *IEEE Computer Society*, 2005, 6 pages.

* cited by examiner

*Primary Examiner* — Son Dinh
(74) *Attorney, Agent, or Firm* — Nixon & Vanderhye P.C.

(57) ABSTRACT

An integrated circuit is provided including at least one array of memory cells having a plurality of rows of memory cells and a plurality of columns of bit cells. Each column of the memory cells is coupled to one of a plurality of bit lines. Each row of the memory cells is coupled to one of a plurality of word lines, to control coupling of that row of memory cells to the plurality of bit lines in dependence on a respective word line signal. Word line driver circuitry is configured to group together the word lines of at least three rows of memory calls, such that the word lines of the at least three rows of memory cells share a common word line signal. Thus in a write operation a written data value written into the array of memory cells is written to at least three memory cells having a shared bit line. Read circuitry is coupled to the plurality of bit lines, configured such that in a read operation, in which the at least three memory cells are all coupled to the shared bit line by means of the common word line signal, a read data value is determined in dependence on a voltage of the shared bit line, dependent on data values stored in the at least three memory cells.

21 Claims, 10 Drawing Sheets

MEMORY WITH IMPROVED DATA RELIABILITY

BACKGROUND OF THE INVENTION

1. Field of the Invention

The field of the invention relates to data storage and in particular, to the storage and access of data in semiconductor memories.

2. Description of the Prior Art

As semiconductor memory devices become ever smaller, operational problems associated with their small scale geometries become more significant. A particular problem is data reliability, wherein due to the small scale of the semiconductor memory device a data value written to the memory device may not be stable and can later be read as a different value. For example a data value may be written as "1", but may be later read as "0", due to a problem in the storage of that value.

The reliability of such semiconductor memory devices is further challenged by the drive to operate such devices at ever lower voltages. As a consequence, these semiconductor devices operate in a regime where two dimensional electric field effects and other effects relating to the physics of the operation of small scale circuit elements (such as gate tunnelling and band-to-band tunnelling) play an ever greater role in disturbing the desired operation of these devices.

Error correction schemes to counteract such error phenomena are known, however these techniques may be of limited applicability, since only a limited number of errors can be corrected. For example, error correction schemes in memory devices typically have a limit of one bit error per word, the occurrence of more than one bit error in a word leading to the inability of the error correction scheme to identify where the error to be corrected is located.

One approach to this problem is to use multiple memory instances which duplicate one another. However, this approach can have the drawback of a significant increase in power consumption, which is an undesirable attribute for contemporary semiconductor devices.

Another approach, in the context of SRAM-based FPGAs is discussed in "On the Optimal Design of Triple Modular Redundancy Logic for SRAM-based FPGAs", Kastensmidt et al., DATE conference 2005, pp. 1290-1295. Here a triple redundancy scheme is used wherein an error in one memory cell can be identified with reference to the other two instances of this memory cell. However, the quantity of extra logic circuitry required to enable the voting mechanism which decides on the correct value is an undesirable feature.

Another approach to this problem in the context in SRAMs is discussed in "SRAM Word-oriented Redundancy Methodology using Built In Self-Repair", J. H. Lee et al., in IEEE International ASIC Conference 2004, pages 219-222. In this paper a word oriented redundancy is used which can be used by a Built In Self-Repair technique to correct errors. However, this technique also requires an undesirable quantity of additional logic to be provided in order to implement the BISR technique.

A further problem that is known to be encountered by such small scale semiconductor memory devices is that of read-disturb. This phenomenon can occur when the voltage at which the semiconductor device is operating is so low that the process of reading the values stored in a memory cell can cause the value itself to be changed. One known approach to this problem is disclosed in "An SRAM Design in 65-nm Technology Node Featuring Read and Write-Assist Circuits to Expand Operating Voltage", H. Pilo et al, JSSC, April 2007. Here the implemented scheme writes back to the read cell, so that it can correct any read-disturb that has been caused.

Commonly assigned patent application publication US2008/0165609 discloses a memory array which is responsive to a repair signal to operate either in a normal mode or a repair mode.

"Quality of a Bit (QoB): A New Concept in Dependable SRAM", Fujiwara et al., $9^{th}$ International Symposium on Quality Electronic Design, 2008, pp. 98-102, describes a technique for protecting a data value stored in a memory cell, but requires a dedicated storage cell to be provided to implement this technique.

It will be recognised that providing mechanisms to increase the reliability of such semiconductor memory devices will necessarily come at the expense of some area on the silicon device, yet it would be desirable to provide a technique to increase the reliability of a semiconductor memory device, in a flexible and efficient manner, without the need for significant additional circuitry taking up valuable space in the semiconductor device.

SUMMARY OF THE INVENTION

Viewed from a first aspect, the present invention provides an integrated circuit comprising: at least one array of memory cells having a plurality of rows of memory cells and a plurality of columns of bit cells; a plurality of bit lines, each of said plurality of bit lines coupled to a respective column of said memory cells; a plurality of word lines each carrying a respective word line signal, each of said plurality of word lines coupled to a respective row of said memory cells to control coupling of said respective row of memory cells to said plurality of bit lines in dependence on said respective word line signal; word line driver circuitry configured to group together the word lines of at least three rows of memory cells, such that said word lines of said at least three rows of memory cells share a common word line signal, such that in a write operation a written data value written into said array of memory cells is written to at least three memory cells in said at least three rows of memory cells, said at least three memory cells having a shared bit line; and read circuitry coupled to said plurality of bit lines, said read circuitry configured such that in a read operation, in which said at least three memory cells are all coupled to said shared bit line by means of said common word line signal, a read data value is determined in dependence on a voltage of said shared bit line, wherein said voltage of said shared bit line is dependent on data values stored in said at least three memory cells, wherein if, at a time of said read operation, one of said at least three memory cells holds a complement value of said written data value, said voltage of said shared bit line nonetheless has a value such that said read data value is determined with the same value as said written data value.

According to the techniques of the present invention, a data value which is written in a write operation into the array of memory cells is written to at least three memory cells. These at least three memory cells are in separate rows of the array of memory cells, and hence are accessed by means of word lines corresponding to each of those rows. Word line driver circuitry is provided to group together the word lines of these at least three rows of memory cells, such that the word lines of these (at least) three rows of memory cells share a common word line signal, in order to enable this (at least) triple write operation to be carried out. Furthermore, the at least three memory cells have a shared bit line, in other words they lie in the same column of the array of memory cells.

The inventors of the present invention realised that a read operation to determine the data value stored in these at least three memory cells could be advantageously implemented by firstly providing that the at least three memory cells are simultaneously coupled to a shared bit line and then determining the read data value in dependence of a voltage of that shared bit line. Not only does this allow the data value to be correctly read when the same data value is present in all of the at least three memory cells, but significantly, if at a time of the read operation one of the at least three memory cells holds a complement value of the written data value (i.e. one of the data values has "bit-flipped" or indeed has never acquired the correct data value in the first place due to an error in the write operation), the presence of the other two "correct" data values would be sufficient such that the voltage of the shared bit line would still be interpreted as the "correct" read data value, i.e. it is determined with the same value as that originally written in the write operation. This triple redundancy scheme (the data value being written in the write operation to at least three memory cells) enables the determination of the read data value, taking into account the values stored in each of the three memory cells, to occur electrically, without the need for additional logic to compare across the redundant data values and determine the correct value. Given the increased likelihood of the presence of such incorrect data values in one of the memory cells as such memory arrays are operated at ever lower voltages, the techniques of the present invention are of particular use when the memory array is being operated close to (or indeed at) its lower voltage limit.

There are a number of ways in which the word line driver could group together the word lines of the at least three rows of memory cells, such that the word lines of the at least three rows of memory cells will share the common word line signal. In one embodiment, said word line driver circuitry is configured to group together said word lines of said at least three rows of memory cells by coupling said word lines together. In other words, the relevant word lines are directly connected to one another. In another embodiment, the relevant word lines need not be directly connected to one another, but said word line driver circuitry is configured to group together said word lines of said at least three rows of memory cells by providing each of said word lines with said common word line signal. In other words, the word line driver circuitry arranges that the three word lines are provided with the same word line signal, and are hence operated in parallel to one another, even though not necessarily directly connected to one another.

It may be the case that a memory device is required to be used in a number of situations, the above described redundancy only being required in some of those situations. It is then advantageous, when the redundancy is not required, for the memory device to be able to be switched into a non-redundant mode, wherein the rows of the array of memory cells are written to individually, a write data value only being written to a single memory cell. Hence, in some embodiments, said word line driver circuitry further comprises mode switching circuitry configured to switch said integrated circuit between a redundant mode and a non-redundant mode, wherein in said redundant mode said word line driver circuitry groups together the word lines of said at least three rows of memory cells and in said non-redundant mode said word line driver provides each word line with an individual word line signal. Hence, the mode switching circuitry enables the integrated circuit to be switched between a redundant mode in which the word line driver circuitry groups together the word lines of said at least rows of memory cells as described above, and a non-redundant mode wherein each word line individually controls a single row of memory cells and hence the full capacity of the array of memory cells may be used, albeit without the provision of the redundancy reliability.

There are a number of ways in which the mode switching circuitry could be arranged to switch the integrated circuit between the redundant mode and the non-redundant mode, but according to one embodiment said mode switching circuitry is configured to switch said integrated circuit between said redundant mode and said non-redundant mode in dependence on a redundant mode enable signal. A redundant mode enable signal provides a convenient and simple mechanism for determining which mode the integrated circuit operates in, which may be provided internally in the integrated circuit or externally from the integrated circuit, and may be hardwired (i.e. fixed) or may vary in time.

In some embodiments, said integrated circuit is configured, during said read operation, to assert said common word line signal corresponding to said at least three memory cells for an additional period, such that if, at a time of said read operation, said one of said at least three memory cells holds said complement value of said written data value, said complement value is caused to revert to said written data value.

Typically, a word line signal is asserted for as short a time as possible, that time period being determined by the length of time required once the respective row of memory cells is connected to their respective bit lines for the data values stored in those memory cells to have affected the voltage of their respective bit lines (e.g. by providing a drainage path by which charge on a bit line may drain away) for sufficiently long for a voltage measurement of a given bit line to determine what data value was stored in the corresponding memory cell. However, the inventors of the present invention realised that by asserting a selected word line signal corresponding to the at least three memory cells for an additional period, the "corrupted" value in the one of the at least three memory cells which holds the complement value of the written data value could be caused to revert to the written data value. This occurs because the additional period for which the selected word line signal is asserted causes the two "correct" memory cells to overpower the "corrupted" memory cell and to cause the corrupted data value to be inverted. In other words, the additional period causes the read operation to become a write operation for the memory cell which holds the complement data value.

The additional period when the common word signal is asserted could be provided by an extension of the normal period for which a word line signal is asserted and thus in one embodiment said additional period is comprised in an extended period when said common word line signal is asserted. Alternatively the additional period could, in another embodiment, be provided by a later period when said common word line signal is reasserted.

The read circuitry of the integrated circuit (e.g. sense amplifiers connected to the bit lines) may be controlled by a read enable signal which initiates the measurement of the voltage of their respective bit line, and in one embodiment said read circuitry is responsive to a read enable signal to initiate measurement of said voltage of said shared bit line, and said integrated circuit is configured to assert said read enable signal whilst said selected word line signal is asserted.

Asserting the read enable signal whilst the selected word line signal is asserted means that the voltage measurement of the shared bit line begins whilst the at least three memory cells are coupled to the shared bit line. The read circuitry can then provide an electrical boost on the shared bit line to cause the corrupted memory cell value to be corrected.

In other embodiments, said read back circuitry further comprises write-back circuitry which connects an output of said read circuitry to said shared bit line. The correct data value which is read out by the read circuitry can thus be used to re-write the corrupted data value by connecting the output of the read circuitry to the shared bit line. Hence, whilst the at least three memory cells are coupled to the shared bit line by means of the selected word line signal being asserted, the output of the read circuitry can re-write the value in those memory cells.

In some embodiments said read circuitry can be selectively decoupled from said plurality of bit lines by respective bit line connection switches. The provision of these bit line connection switches which enable read circuitry to be selectively decoupled from each bit line enables the system designer a greater degree of control over the manner in which the read circuitry operates. On the one hand the read circuitry may then only be connected to the bit lines when the reading operation is required to be carried out, and on the other hand if the common word line signal is being asserted for an additional period, in order to cause said complement value to revert to said written data value, controlling the timing of when the read circuitry is connected to the shared bit line can give an advantageous degree of control over the sequence of events, namely the reading of the read value and the correction of that value where appropriate.

The integrated circuit may be arranged to write the written data value to just three memory cells, which may be considered to provide sufficient redundancy to ensure the required level of reliability. However, in situations where a higher level of reliability is required, or for example where the environment in which the integrated circuit must operate is particularly hostile (a high radiation environment, say), the integrated circuit may be arranged such that in said write operation said written data value is written to more than three memory cells, and wherein if, at a time of said read operation, a minority of said more than three memory cells holds said complement value of said written data value, said voltage of said shared bit line nonetheless has said value such that said read data value is determined with the same value as said written data value. Hence, in an example where the written data value is written to five memory cells (providing a significant degree of redundancy and hence reliability), it has been found in accordance with the above-described techniques that even if two memory cells (a minority) hold the complement value, the correct read value may nevertheless be determined by virtue of the other three memory cells (the majority) holding the correct data value.

In some embodiments, said read data value is determined in dependence on said voltage of said shared bit line relative to a predetermined threshold. This predetermined threshold may for example be provided by a reference voltage, with which the voltage on the shared bit line may be compared.

In some embodiments said integrated circuit further comprises a plurality of complementary bit lines, each of said plurality of complementary bit lines associated with a respective one of said plurality of bit lines, and wherein said read circuitry is further configured such that, in said read operation, said at least three memory cells are further coupled to a shared complementary bit line associated with said shared bit line and said read data value is determined in dependence on a voltage difference of said shared bit line and said shared complementary bit line. The use of bit lines and respective complementary bit lines provides a stable mechanism for writing to and reading from the memory cells, since each memory cell will typically be embodied by a feedback loop of cross-coupled drivers in which the stored data value is represented by the charge held at the node at each side of the loop. Furthermore, the provision of complementary bit lines enables a more sensitive read measurement to be performed, it being carried out in dependence on a voltage difference between the shared bit line and the shared complementary bit line.

The at least three rows of memory cells may be configured in the array of memory cells in various ways. In one embodiment said at least three rows of memory cells are adjacent rows in said array of memory cells. In another embodiment said at least three rows of memory cells are each separated from one another by at least one intervening row in said array of memory cells. The particular arrangement of the at least three rows of memory cells relative to one another will depend on particular system requirements. Whilst the at least three rows may be arranged adjacent to one another, separating the at least three rows of memory cells from one another may be desirable from an addressing point of view, and further has the advantage that localised problems in the memory array, e.g. an ionising particle passing through part of the memory array, may be better resisted by spreading out the stored data across the memory array.

In some embodiments said integrated circuit is a static random access memory, whilst in other embodiments said integrated circuit is a dynamic random access memory. In some embodiments said integrated circuit is a cache memory.

Viewed from a second aspect the present invention provides an integrated circuit comprising: at least one array of memory cells having a plurality of rows of memory cells and a plurality of columns of bit cells; a plurality of bit lines, each of said plurality of bit lines coupled to a respective column of said memory cells; a plurality of word lines each carrying a respective word line signal, each of said plurality of word lines coupled to a respective row of said memory cells to control coupling of said respective row of memory cells to said plurality of bit lines in dependence on said respective word line signal; word line driver means for grouping together the word lines of at least three rows of memory cells, such that said word lines of said at least three rows of memory cells share a common word line signal, such that in a write operation a written data value written into said array of memory cells is written to at least three memory cells in said at least three rows of memory cells, said at least three memory cells having a shared bit line; and reading means coupled to said plurality of bit lines, said reading means for determining a read data value in dependence on a voltage of said shared bit line in a read operation, in which said at least three memory cells are coupled to said shared bit line by means of said common word line signal, wherein said voltage of said shared bit line is dependent on data values stored in said at least three memory cells, wherein if, at a time of said read operation, one of said at least three memory cells holds a complement value of said written data value, said voltage of said shared bit line nonetheless has a value such that said read data value is determined with the same value as said written data value.

Viewed from a third aspect, the present invention provides a method of operating an integrated circuit comprising at least one array of memory cells having a plurality of rows of memory cells and a plurality of columns of bit cells; a plurality of bit lines, each of said plurality of bit lines coupled to a respective column of said memory cells; and a plurality of word lines each carrying a respective word line signal, each of said plurality of word lines coupled to a respective row of said memory cells to control coupling of said respective row of memory cells to said plurality of bit lines in dependence on said respective word line signal, the method comprising the steps of: grouping together the word lines of at least three rows of memory cells, such that said word lines of said at least three rows of memory cells share a common word line signal, such that in a write operation a written data value written into said array of memory cells is written to at least three memory cells in said at least three rows of memory cells, said at least three memory cells having a shared bit line; and determining a read data value in dependence on a voltage of said shared bit line in a read operation, in which said at least three memory cells are coupled to said shared bit line by means of said common word line signal, wherein said voltage of said shared bit line is dependent on data values stored in said at least three memory cells, wherein if, at a time of said read operation, one of said at least three memory cells holds a complement value of said written data value, said voltage of said shared bit line nonetheless has a value such that said read data value is determined with the same value as said written data value.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
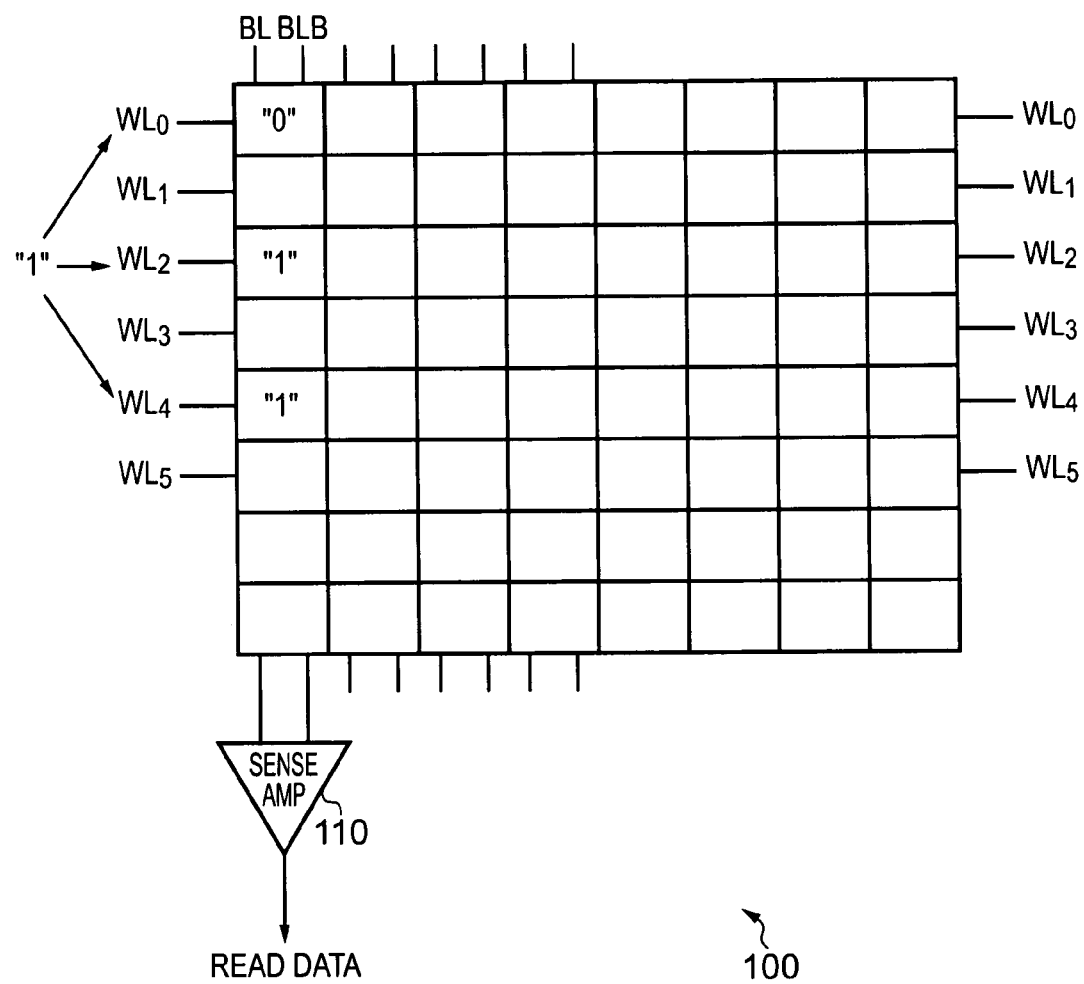
FIG. 1 schematically illustrates an array of memory cells according to one embodiment.

FIG. 1 schematically illustrates an integrated circuit comprising an array of memory cells 100. In this embodiment the integrated circuit is an SRAM device, although in other embodiments the integrated circuit may be a DRAM device. Each column of the array 100 has an associated bit line BL and an associated complementary bit line BLB. Each row of the array 100 has an associated word line WL which controls the coupling of the memory cells in that row to the respective bit line and complementary bit line for each memory cell. Each column of memory cells has an associated sense amplifier 110, which is configured to measure a voltage difference between the bit line BL and the complementary bit line BLB, and to determine in dependence on the voltage difference the data value stored in a memory cell in that column which is currently activated by its corresponding word line signal WL. In the illustrated embodiment, the array of memory cells 100 is being operated at a very low voltage, increasing the likelihood of errors in the data values stored in each memory cell. Word line driver circuitry (not explicitly illustrated here, but described in more detail below with reference to FIG. 2) couples together the word lines of three rows of memory cells (e.g. $WL_0$, $WL_2$ and $WL_4$ as shown), such that a data value written into the array of memory cells is written to three memory cells at once. Hence, as shown the data value "1" is written into three memory cells. However, as illustrated, the data value which results in the memory cell corresponding to word line $WL_0$ is "0", due to an error having occurred in this memory cell. This could for example be because this memory cell array is operating at very low voltage, increasing the likelihood for such data errors to occur. Other sources of data error are of course possible such as the passage of an ionizing particle through this memory cell. During a read operation of this array of memory cells 100, three word lines are simultaneously asserted, for example $WL_0$, $WL_2$ and $WL_4$ in the example shown. This causes the three stored data values illustrated to be simultaneously read by sense amplifier 110. The sense amplifier 110 determines whether a "1" or a "0" is stored based on the relative voltages of the bit line BL and the complementary bit line BLB. The particular value of a data value stored in a memory cell determines how the relative voltages of BL and BLB will develop with respect to one another. The presence of two "1" values in this group of three memory cells is sufficient to outweigh the presence of the single "0" value, and the sense amplifier generates a read value of "1" despite the presence of the single corrupted value.

Figure 2A:
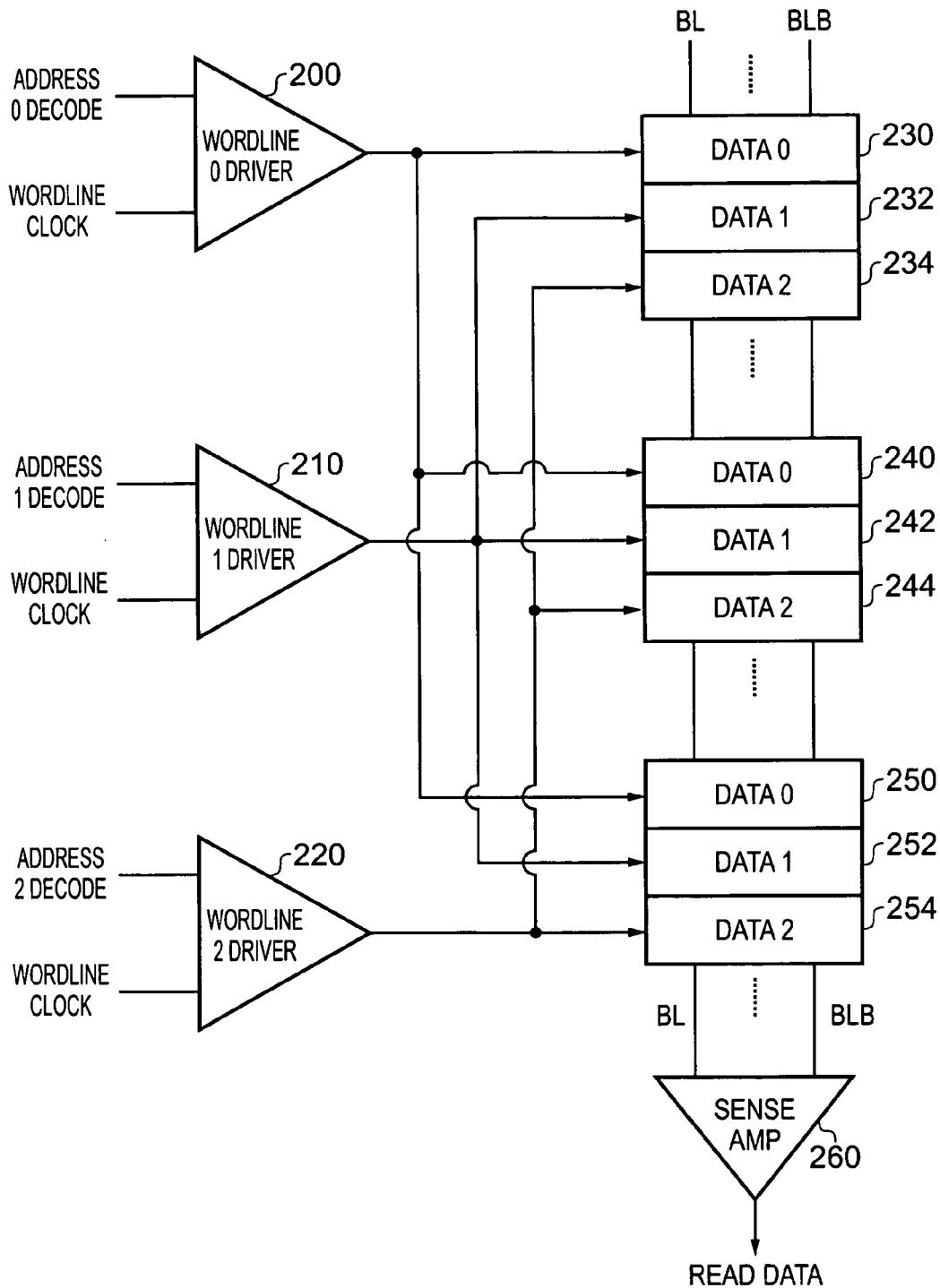
FIG. 2A schematically illustrates word line driver circuitry for an array of memory cells in one embodiment.

FIG. 2A schematically illustrates the word line driver circuitry which provides the coupling together of the three rows of memory cells as mentioned above with reference to FIG. 1. Three word line drivers 200, 210 and 220 are provided. Each of the word line drivers receives an address decode signal and a word line clock signal. Hence, word line 0 driver 200 receives address 0 decode signal and the word line clock, such that if the word line clock is enabled and address 0 is selected then word line 0 driver 200 asserts a word line signal which is coupled to memory cells 230, 240 and 250. Similarly word line 1 driver 210 (in dependence on address 1 decode signal) asserts a word line signal coupled to memory cells 232, 242 and 252. Similarly word line 2 driver 220 (in dependence on address 2 decode signal) asserts a word line signal coupled to memory cells 234, 244 and 254. Hence, a data value written into the memory cells is simultaneously written into three associated memory cells.

During a read operation one of the address decode signals is asserted, and when the word line clock goes high, the selected word line driver causes its set of three word line signals to be asserted. This couples the corresponding set of three memory cells to the bit line BL and complementary bit line BLB associated with this column of memory cells. The bit lines have been pre-charged, and the data values stored in the set of three selected memory cells then either cause that pre-charged value to be held essentially stably on the bit lines or to begin to decay depending on the value stored. A voltage measurement of the difference between the bit lines BL and BLB is made by sense amplifier 260 which then generates a read data value. As mentioned above, the arrangement of sense amplifier 260 is such that even if one of the three data values is corrupted, the sense amplifiers will nevertheless read the data value correctly, since the effect of the other two data values on the bit lines dominate the corrupted data value which is in the minority.

Figure 2B:
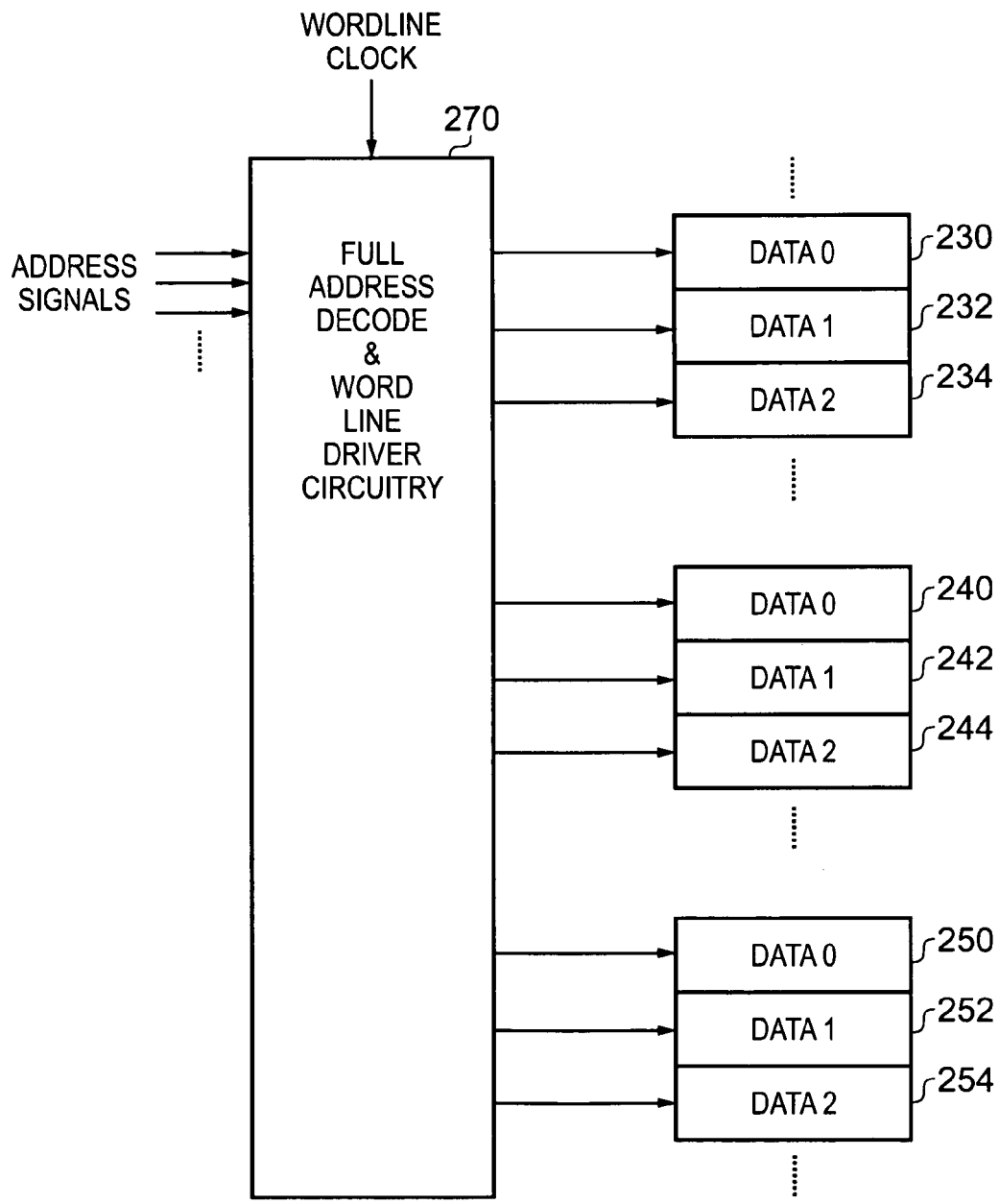
FIG. 2B schematically illustrates the word line driver circuitry in one embodiment.

FIG. 2B schematically illustrates an alternative arrangement for the word line driver circuitry, illustrated in FIG. 2B by full address decode and word line driver circuitry 270.

Hence in this example both address decoding and word line signal generation can be considered to take place within component 270. This component receives the various address signals and the word line clock, and generates individual word line signals that are applied to the rows of memory cells in the array. The memory cells, bit lines and sense amplifier are the same as those described with reference to FIG. 2A and are not further described here. The full address decode and word line driver circuitry 270 is thus configured to convert a single address signal into multiple word line signals, such that in response to one address signal a group of rows are activated.

Figure 3:
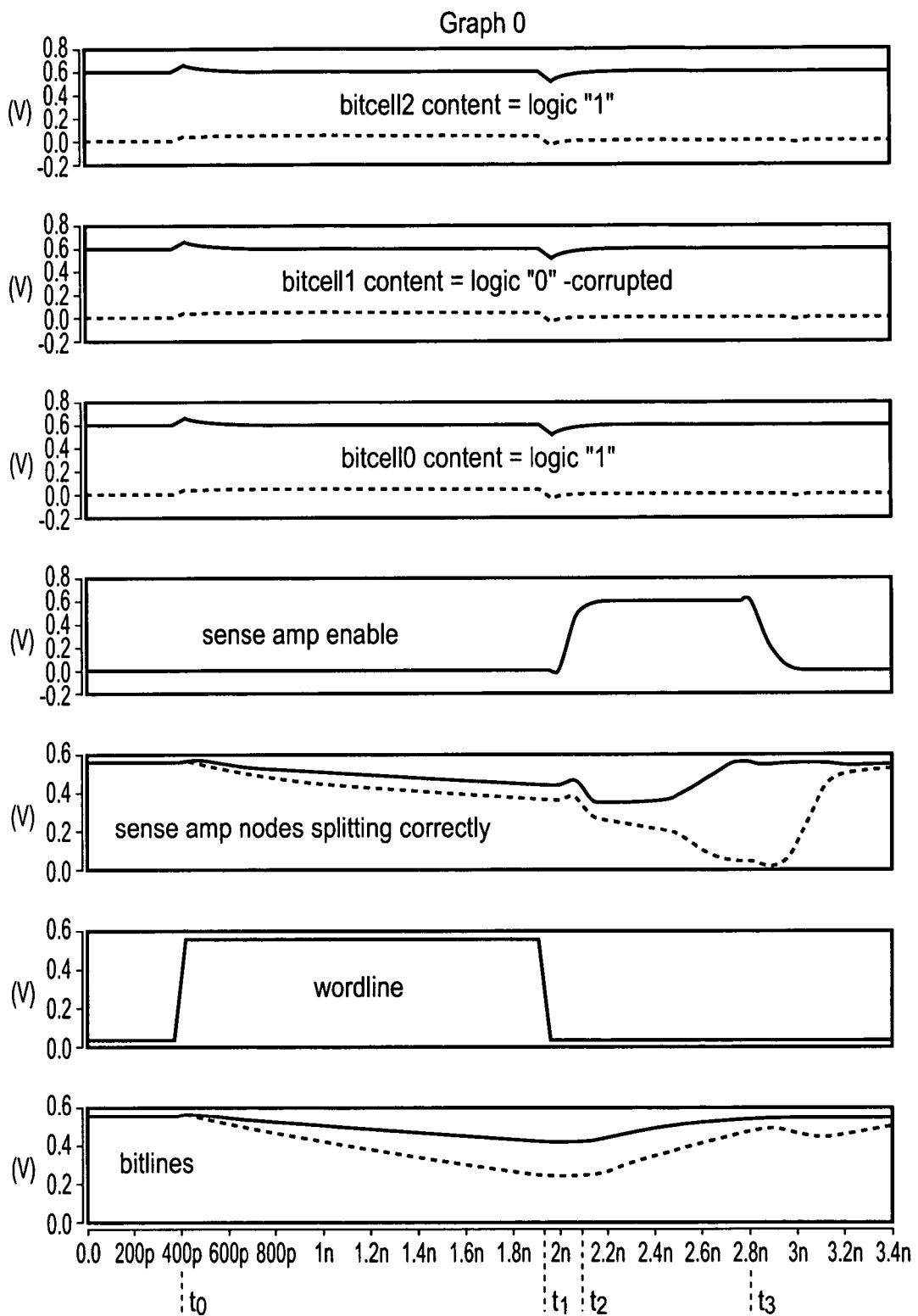
FIG. 3 shows simulation results for a read operation of three memory cells wherein one memory cell contains a corrupted data value according to one embodiment.

FIG. 3 illustrates a simulation of a read process for three bit cells wherein one of them (bit cell 1) contains a corrupted value (0 instead of the correct value of 1). The read process illustrated in FIG. 3 begins at time $t_0$ where the word line clock goes high, coupling the three bit cells (bit cell 0, bit cell 1 and bit cell 2) to their shared bit lines (i.e. their bit line and their complementary bit line). The word line clock remains high until time $t_1$, when the word line signal goes low. Shortly thereafter the sense amp is enabled at time $t_2$ remaining enabled until time $t_3$ when the sense amp enable signal is de-asserted. It can be seen from FIG. 3 that the voltages on the sense amp nodes (see plot label "sense amp nodes splitting correctly") begin to diverge from time $t_0$ when the word line signal is first asserted, and furthermore by the time $t_1$ when the word line signal is de-asserted the sense amp nodes have split sufficiently for a reading of the value stored in these three bit cells to be correctly made. This reading begins at time $t_2$ when the sense amp is enabled, whereafter it can be seen that the voltages on the sense amp nodes then further diverge, due to the activity of the sense amp. Shortly before time $t_3$ when the sense amp is disabled, the value at the output of the sense amp is latched into the further circuitry as the measured value. The fact that the sense amp node voltages split correctly despite the logical value "0" being stored in bit cell 1 demonstrates the ability of the arrangement to nevertheless recognise the correct data value originally written into these three bit cells by virtue of the content of bit cell 0 and bit cell 2.

Figure 4:
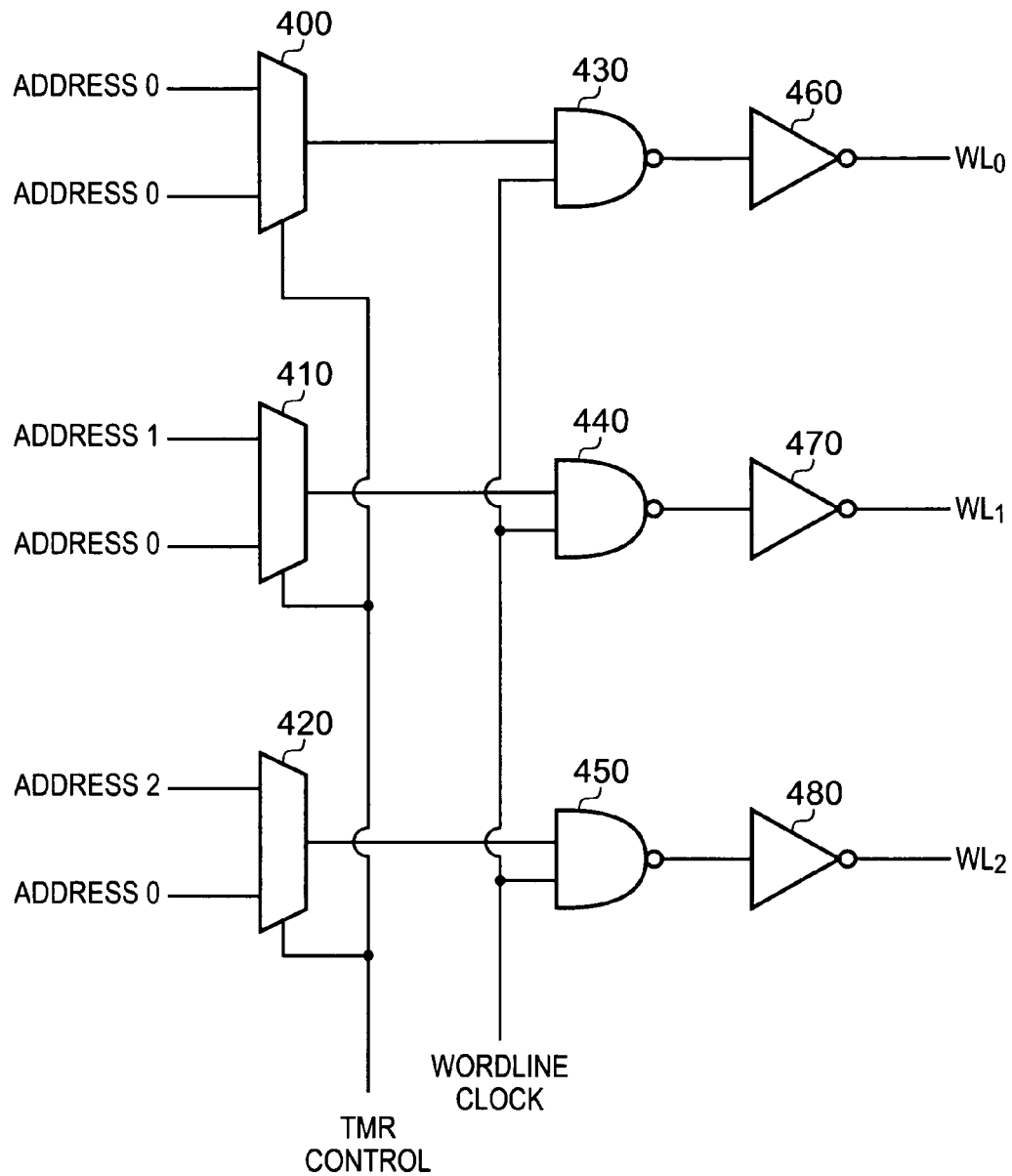
FIG. 4 schematically illustrates mode switching circuitry according to one embodiment.

FIG. 4 schematically illustrates mode switching circuitry in one embodiment, configured to switch the memory array between a redundant mode and a non-redundant mode. In the non-redundant mode, the rows of the memory array are addressed individually by their own respective word line signals and no redundancy is provided for the storage of data values in the memory array. In the redundant mode, a given data value is stored in three memory cells (as described above). Hence, the memory array may be switched into the redundant mode when required, for example when the memory array is being operated at very low voltages, increasing the likelihood that any given memory cell will (incorrectly) store (or store and then change to) the complement of the data value it is instructed to store. The mode switching circuitry comprises mode switching selection multiplexers 400, 410 and 420, which each receive the address decode signal address 0 at one input, and receive the address decode signals address 0, address 1 and address 2 at their other inputs respectively. The multiplexers 400, 410 and 420 are configured to select between their inputs in dependence on the redundant mode enable signal TMR control ("triple modular redundancy control"). The output of each multiplexer is provided as the input for NAND gates 430, 440 and 450 which each receive the word line clock as their other input. The output of the NAND gates 430, 440 and 450 are inverted by inverters. 460, 470 and 480 to finally provide the word line signals $WL_0$, $WL_1$ and $WL_2$. Hence, when the signal TMR control is disabled, the multiplexers 400, 410 and 420 select their upper (as illustrated) inputs. Each of the word line signals $WL_0$, $WL_1$ and $WL_2$ are thus provided by the combination of the address decode signals address 0, address 1 and address 2 and the word line clock. However, when the signal TMR control is enabled, all three word line signals are generated in dependence on the address decode signal address 0 and the word line clock.

Figure 5:
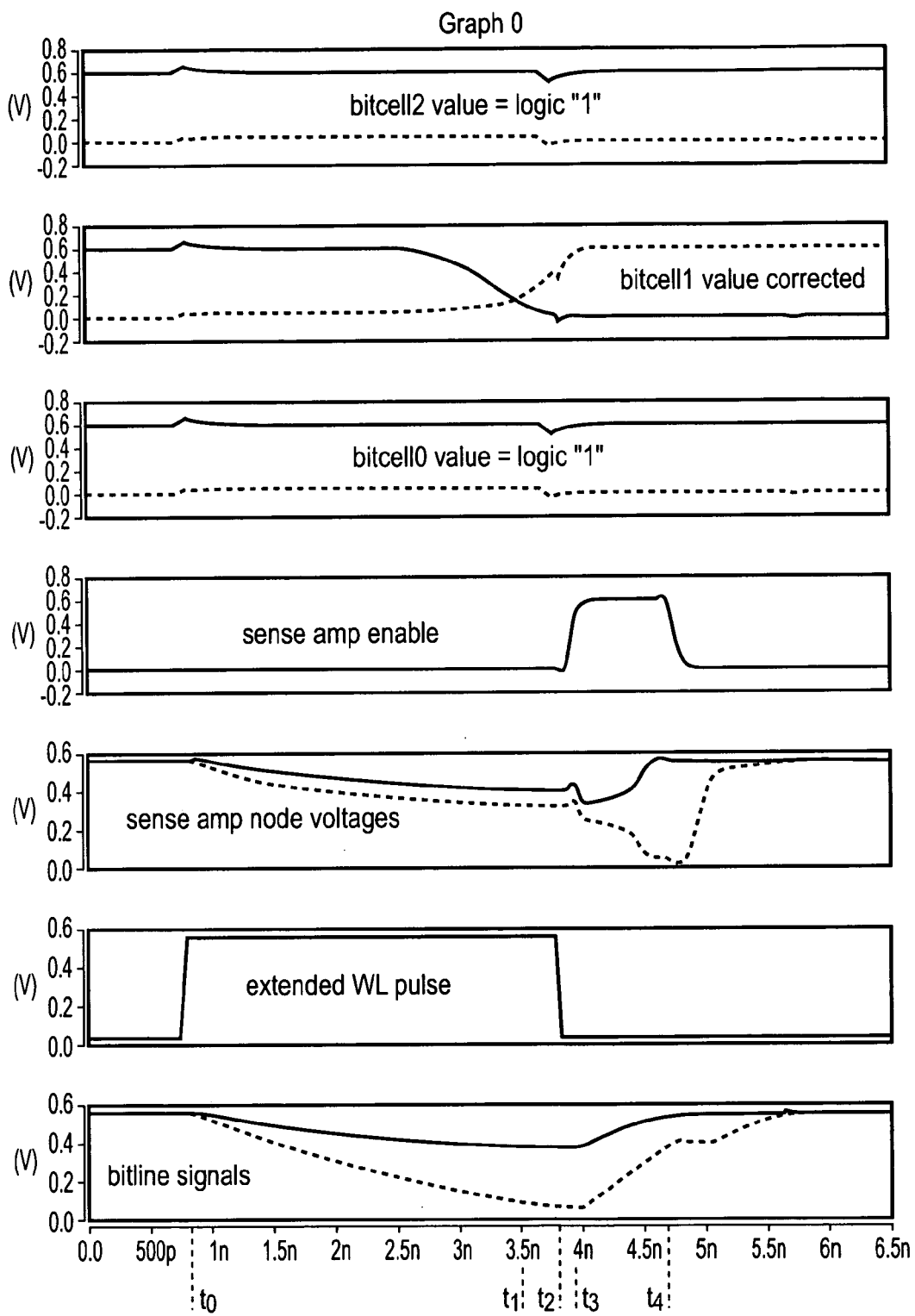
FIG. 5 shows a simulation of an extended word line pulse being used to enable the correction of a corrupted memory cell's value according to one embodiment.

FIG. 5 shows a simulation of the reading of a set of three bit cells, wherein once more the content of bit cell 0 and bit cell 1 is the correct value of "1", whilst the content of bit cell 1 has been corrupted to a logical value of "0", as was the case in the simulation shown in FIG. 3. However, in this example, the integrated circuit is configured to apply an extended word line pulse to the bit cells during the read operation. As before the word line pulse begins at time $t_0$ and it can be seen that despite the corrupted values stored in bit cell 1, the sense amp node voltages begin to split correctly at time $t_0$. Furthermore, it can be seen in FIG. 5 that before the extended word line pulse ends at time $t_2$ the bits eventually respond to the effect of the values stored in the other two bit cells causing the bit line signals to split in accordance with the logical "1" stored therein, to the point that at time $t_1$ the bit cell 1 value inverts and rapidly establishes itself as the correct value. Hence, at time $t_3$ when the sense amp is enabled, the sense amp node voltages rapidly diverge and the value at the output of the sense amp can be latched into the rest of the circuitry shortly before the sense amp is disabled at time $t_4$.

Figure 6A:
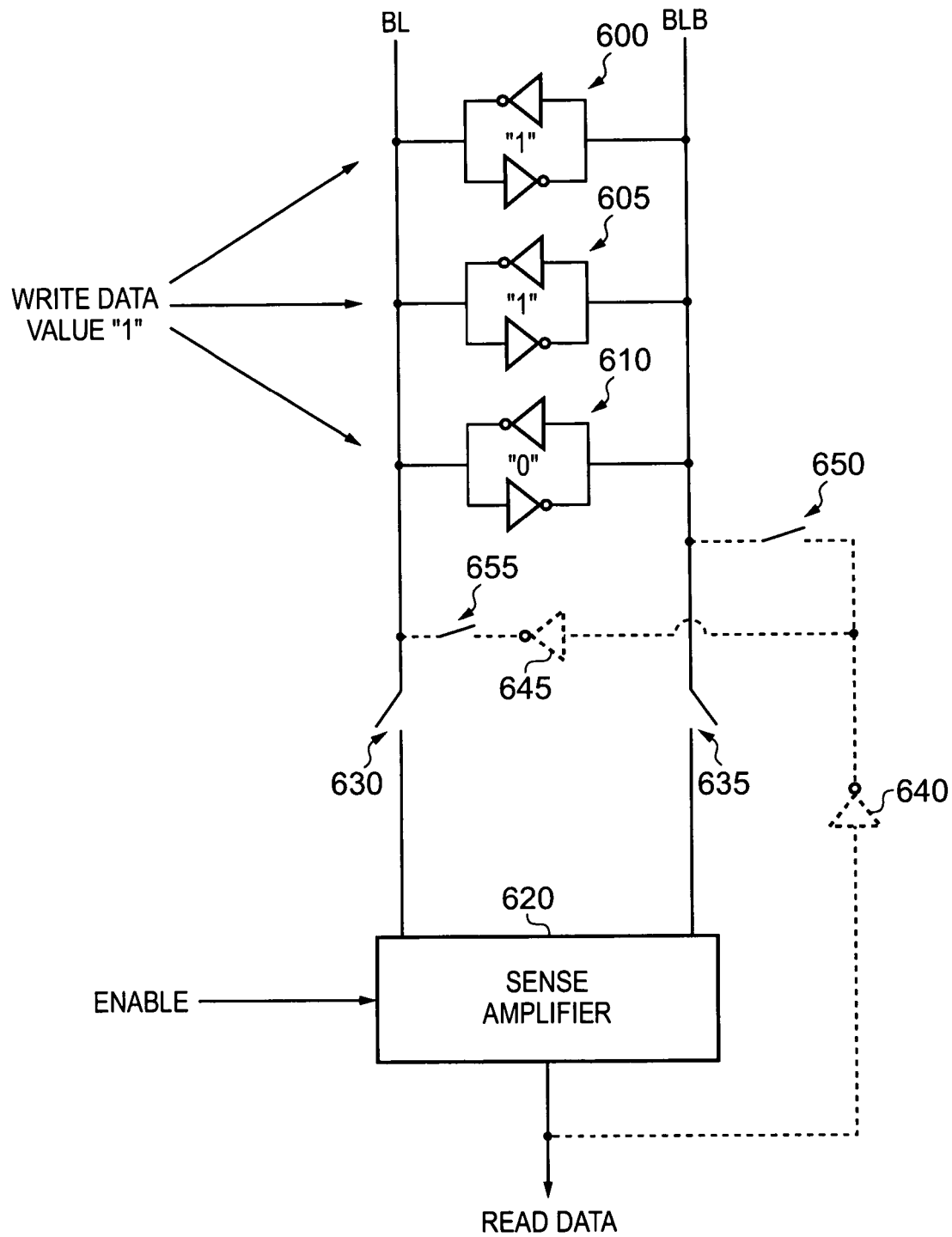
FIG. 6A schematically illustrates read circuitry in one embodiment.

FIG. 6A schematically illustrates the read circuitry coupled to one column of memory cells according to one embodiment. For clarity, only three memory cells 600, 605 and 610 are illustrated, these memory cells forming a group of three into which a data value has been written. It can be seen in FIG. 6A that the value in memory cell 610 has flipped to become an incorrect logical "0". The sense amplifier 620 is coupled to the bit lines BL and BLB and is configured to determine a read data value in dependence on a voltage measurement of the respective bit lines. The sense amplifier 620 is configured to perform its voltage measurement in response to an ENABLE signal. During a read operation (as described with reference to FIG. 3) a word line pulse couples the three bit cells 600, 605, 610 to the bit lines BL and BLB so that the data values stored in the bit cells begin to discharge one of the bit lines faster than the other in dependence on the particular value of the data value stored therein. Once sufficient splitting of the bit lines has occurred, the sense amplifier 620 can be enabled and the read data value is generated.

The word line pulse applied to the bit cells may be applied for an additional period (as illustrated by the extended word line pulse in FIG. 5), such that the data value that is in the majority of bit cells (600 and 605 in FIG. 6A) "overpowers" the corrupted data value stored in the minority (bit cell 610 in FIG. 6A). The signal ENABLE is thereafter applied to sense amplifier 620 to read the data value in the set of three bit cells (now the same in all three).

Each of the bit lines BL and BLB are also provided with respective bit line connection switches 630 and 635, which are configured to selectively decouple the sense amplifier 620 from the bit lines BL and BLB. Further, in one embodiment (illustrated by the dashed lines in FIG. 6A) the read circuitry further comprises write-back circuitry in the form of inverters 640, 645 which couple the output of sense amplifier 620 back to the respective bit lines and switches 650 and 655 which selectively enable this coupling of the output of the sense amplifier 620 via inverters 640, 645 to the bit lines. Inverter 645 is connected to the output of inverter 640, such that the bit lines BL and BLB receive complementary signals. One embodiment of the present invention provides that the sense amplifier 620 is isolated from the bit lines by means of the bit line connection switches 630, 645, before the read data value at the output sense amplifier 620 is written back to the bit lines BL and BLB. In this embodiment the common word line signal received by the bit cells 600, 605, 610 is configured to be asserted, in an additional period corresponding to this write-back operation, such that the read data value being asserted on the bit lines is caused to be written into the set of bit cells.

Figure 6B:
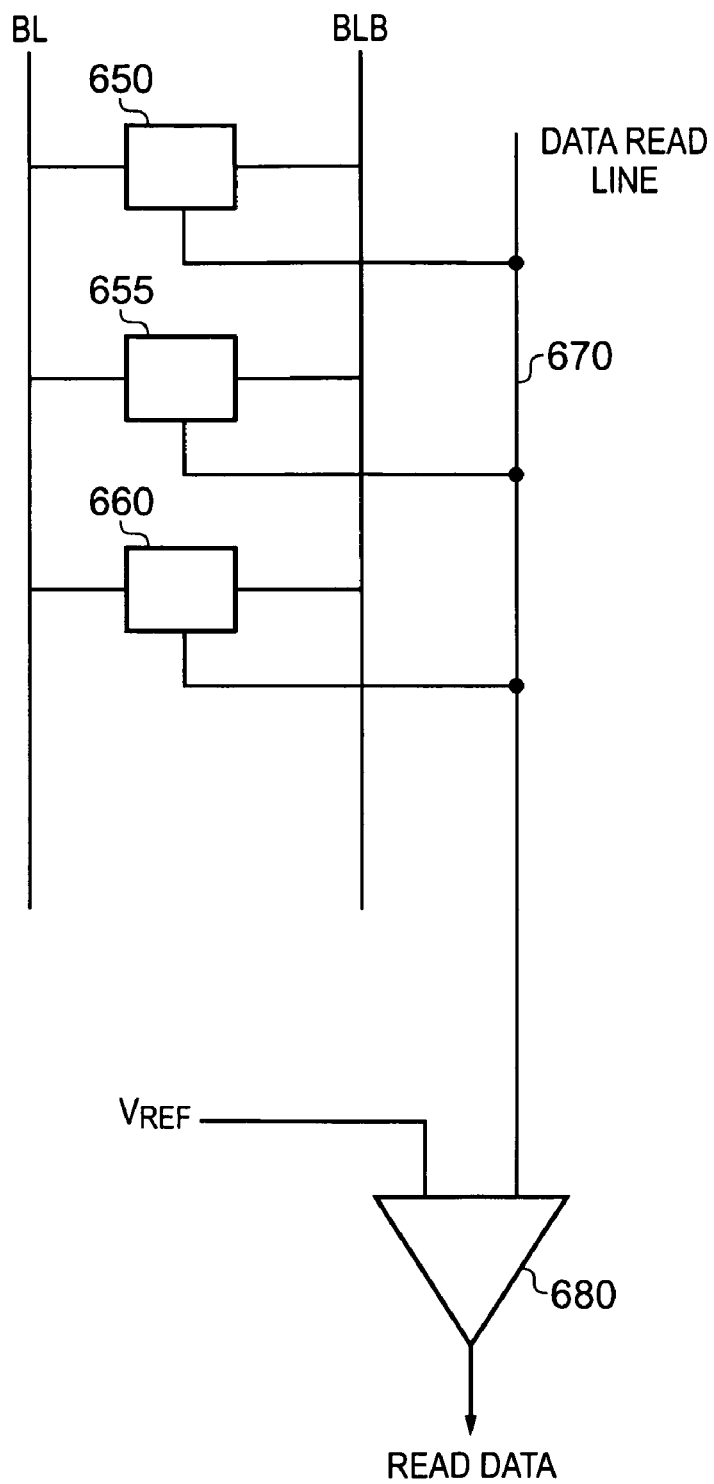
FIG. 6B schematically illustrates read circuitry in another embodiment.

In the embodiment shown in FIG. 6A the read circuitry performs the voltage measurement in dependence on a voltage difference between the respective bit lines. FIG. 6B schematically illustrates an alternative arrangement in which a set of memory cells 650, 655, 660 arranged between shared bit lines BL and BLB are provided with an additional connection to an additional data read line 670. This data read line 670, which provides an additional shared bit line for this column of bit cells, is coupled to read circuitry 680. Read circuitry 680 performs the voltage measurement of data read line 670 by comparison with a reference voltage $V_{REF}$.

Figure 7:
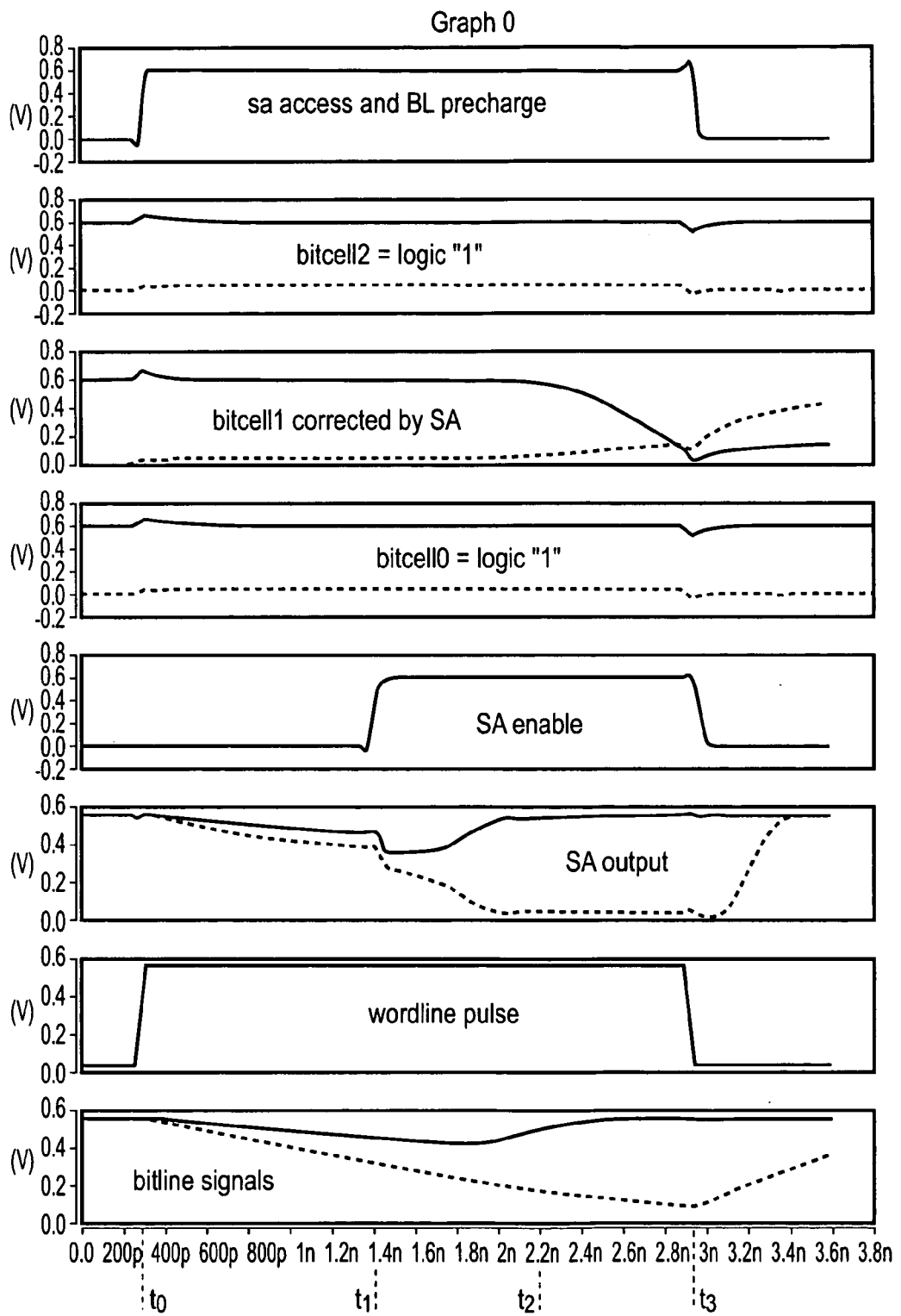
FIG. 7 shows a simulation of the output of read circuitry being used to write back a corrected data value according to one embodiment.

FIG. 7 shows another simulation of a read operation according to one embodiment of the present invention. In this example, the read process begins at time $t_0$ where the word line pulse begins and the bit lines are pre-charged. It can be seen in FIG. 7 that from time $t_0$ onwards the bit line signals begin to diverge from one another as the values stored in bit cells 0, 1 and 2 begin to affect the voltages of the pre-charged bit lines. Here the process differs from that illustrated with regard to FIG. 5, since the sense amp enable signal is already asserted at time $t_1$, before any "self-correction" of bit cell 1 has occurred. Instead, in this arrangement it is the enabling of the sense amplifier (between times $t_1$ and $t_3$) which causes the correction of the corrupted values stored in bit cell 1. It can be seen that at around time $t_2$, the data values stored in bit cell 0 and bit cell 2, in combination with the active sense amplifier, begins to invert the data value stored in bit cell 1. By the time the sense amplifier activity ends at time $t_3$, the data value stored in bit cell 1 has inverted. Whilst in FIG. 7 the word line pulse is illustrated as a continuous pulse, it is also possible for the word line pulse to be asserted in two stages, a first initial pulse followed by an additional pulse to allow the correction of the corrupted bit cell by the sense amplifier activity.

Figure 8:
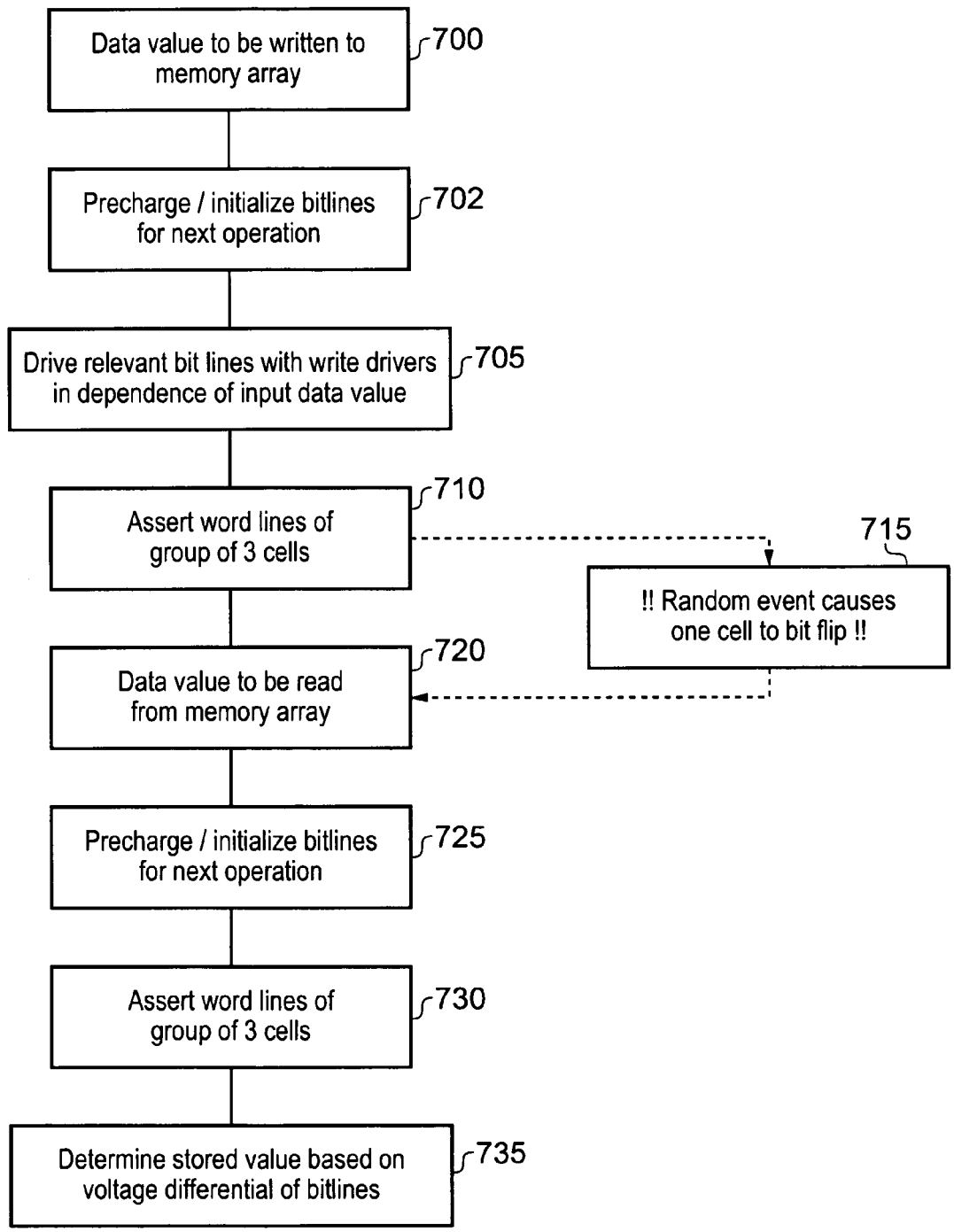
FIG. 8 schematically illustrates a series of steps taken in one embodiment when writing and reading data value.

FIG. 8 schematically illustrates a series of steps taken in an array of memory cells according to one embodiment. The flow begins at step 700 where a new data value is required to be written into the memory array. At step 702, the bitlines are precharged and initialized ready for the next operation. At step 705, in dependence on the value of that data value, the data value is driven onto the relevant bit lines corresponding to the memory cells into which this data value should be written. Then, at step 710 the word lines corresponding to the group of three cells into which the data value will be written are asserted, causing the data value to be written into those three memory cells.

Later, at step 720, this data value is required to be read from the memory array. Hence, at step 725 the relevant bit lines are appropriately precharged and initialized. At step 730 the word lines corresponding to the group of three cells into which this data value is stored are asserted and at step 735 the data value is determined based on the voltage differential between the bit lines of this column of cells. FIG. 8 further illustrates a step 715, in which a random event (such as an ionising radiation strike) causes one cell of the three to bit flip after being written, but before being read. The techniques of the present invention allow the correct data value to nonetheless be read at step 735.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. For example, various combinations of the features of the following dependent claims could be made with the features of the independent claims without departing from the scope of the present invention.

We claim:

1. An integrated circuit comprising:
at least one array of memory cells having a plurality of rows of memory cells and a plurality of columns of bit cells;
a plurality of bit lines, each of said plurality of bit lines coupled to a respective column of said memory cells;
a plurality of word lines each carrying a respective word line signal, each of said plurality of word lines coupled to a respective row of said memory cells to control coupling of said respective row of memory cells to said plurality of bit lines in dependence on said respective word line signal;
word line driver circuitry configured to group together the word lines of at least three rows of memory cells, such that said word lines of said at least three rows of memory cells share a common word line signal, such that in a write operation a written data value written into said array of memory cells is written to at least three memory cells in said at least three rows of memory cells, said at least three memory cells having a shared bit line; and
read circuitry coupled to said plurality of bit lines, said read circuitry configured such that in a read operation, in which said at least three memory cells are all coupled to said shared bit line by means of said common word line signal, a read data value is determined in dependence on a voltage of said shared bit line, wherein said voltage of said shared bit line is dependent on data values stored in said at least three memory cells,
wherein if, at a time of said read operation, one of said at least three memory cells holds a complement value of said written data value, said voltage of said shared bit line nonetheless has a value such that said read data value is determined with the same value as said written data value.

2. The integrated circuit as claimed in claim 1, wherein said word line driver circuitry is configured to group together said word lines of said at least three rows of memory cells by coupling said word lines together.

3. The integrated circuit as claimed in claim 1, wherein said word line driver circuitry is configured to group together said word lines of said at least three rows of memory cells by providing each of said word lines with said common word line signal.

4. The integrated circuit as claimed in claim 1, wherein said word line driver circuitry further comprises mode switching circuitry configured to switch said integrated circuit between a redundant mode and a non-redundant mode, wherein in said redundant mode said word line driver circuitry groups together the word lines of said at least three rows of memory cells and in said non-redundant mode said word line driver provides each word line with an individual word line signal.

5. The integrated circuit as claimed in claim 4, wherein said mode switching circuitry is configured to switch said integrated circuit between said redundant mode and said non-redundant mode in dependence on a redundant mode enable signal.

6. The integrated circuit as claimed in claim 1, wherein said integrated circuit is configured, during said read operation, to assert said common word line signal corresponding to said at least three memory cells for an additional period, such that if, at a time of said read operation, said one of said at least three memory cells holds said complement value of said written data value, said complement value is caused to revert to said written data value.

7. The integrated circuit as claimed in claim 6, wherein said additional period is comprised in an extended period when said common word line signal is asserted.

8. The integrated circuit as claimed in claim 6, wherein said additional period is a later period when said common word line signal is reasserted.

9. The integrated circuit as claimed in claim 6, wherein said read circuitry is responsive to a read enable signal to initiate measurement of said voltage of said shared bit line, and wherein said integrated circuit is configured to assert said read enable signal whilst said common word line signal is asserted.

10. The integrated circuit as claimed in claim 6, wherein said read circuitry further comprises write-back circuitry which connects an output of said read circuitry to said shared bit line.

11. The integrated circuit as claimed in claim 1, wherein said read circuitry can be selectively decoupled from said plurality of bit lines by respective bit line connection switches.

12. The integrated circuit as claimed in claim 1, wherein in said write operation said written data value is written to more than three memory cells, and wherein if, at a time of said read operation, a minority of said more than three memory cells holds said complement value of said written data value, said voltage of said shared bit line nonetheless has said value such that said read data value is determined with the same value as said written data value.

13. The integrated circuit as claimed in claim 1, wherein said read data value is determined in dependence on said voltage of said shared bit line relative to a predetermined threshold.

14. The integrated circuit as claimed in claim 1, wherein said integrated circuit further comprises a plurality of complementary bit lines, each of said plurality of complementary bit lines associated with a respective one of said plurality of bit lines, and wherein said read circuitry is further configured such that, in said read operation, said at least three memory cells are further coupled to a shared complementary bit line associated with said shared bit line and said read data value is determined in dependence on a voltage difference of said shared bit line and said shared complementary bit line.

15. The integrated circuit as claimed in claim 1, wherein said at least three rows of memory cells are adjacent rows in said array of memory cells.

16. The integrated circuit as claimed in claim 1, wherein said at least three rows of memory cells are each separated from one another by at least one intervening row in said array of memory cells.

17. The integrated circuit as claimed in claim 1, wherein said integrated circuit is a static random access memory.

18. The integrated circuit as claimed in claim 1, wherein said integrated circuit is a dynamic random access memory.

19. The integrated circuit as claimed in claim 1, wherein said integrated circuit is a cache memory.

20. An integrated circuit comprising:
at least one array of memory cells having a plurality of rows of memory cells and a plurality of columns of bit cells;
a plurality of bit lines, each of said plurality of bit lines coupled to a respective column of said memory cells;
a plurality of word lines each carrying a respective word line signal, each of said plurality of word lines coupled to a respective row of said memory cells to control coupling of said respective row of memory cells to said plurality of bit lines in dependence on said respective word line signal;
word line driver means for grouping together the word lines of at least three rows of memory cells, such that said word lines of said at least three rows of memory cells share a common word line signal, such that in a write operation a written data value written into said array of memory cells is written to at least three memory cells in said at least three rows of memory cells, said at least three memory cells having a shared bit line; and
reading means coupled to said plurality of bit lines, said reading means for determining a read data value in dependence on a voltage of said shared bit line in a read operation, in which said at least three memory cells are coupled to said shared bit line by means of said common word line signal, wherein said voltage of said shared bit line is dependent on data values stored in said at least three memory cells,
wherein if, at a time of said read operation, one of said at least three memory cells holds a complement value of said written data value, said voltage of said shared bit line nonetheless has a value such that said read data value is determined with the same value as said written data value.

21. A method of operating an integrated circuit comprising at least one array of memory cells having a plurality of rows of memory cells and a plurality of columns of bit cells;
a plurality of bit lines, each of said plurality of bit lines coupled to a respective column of said memory cells; and
a plurality of word lines each carrying a respective word line signal, each of said plurality of word lines coupled to a respective row of said memory cells to control coupling of said respective row of memory cells to said plurality of bit lines in dependence on said respective word line signal,
the method comprising the steps of:
grouping together the word lines of at least three rows of memory cells, such that said word lines of said at least three rows of memory cells share a common word line signal, such that in a write operation a written data value written into said array of memory cells is written to at least three memory cells in said at least three rows of memory cells, said at least three memory cells having a shared bit line; and
determining a read data value in dependence on a voltage of said shared bit line in a read operation, in which said at least three memory cells are coupled to said shared bit line by means of said common word line signal, wherein said voltage of said shared bit line is dependent on data values stored in said at least three memory cells,
wherein if, at a time of said read operation, one of said at least three memory cells holds a complement value of said written data value, said voltage of said shared bit line nonetheless has a value such that said read data value is determined with the same value as said written data value.

* * * * *